United States Patent
Oba et al.

(10) Patent No.: US 10,737,947 B2
(45) Date of Patent: Aug. 11, 2020

(54) ZINC NITRIDE COMPOUND AND METHOD FOR PRODUCING SAME

(71) Applicant: Panasonic Corporation, Kadoma-shi, Osaka (JP)

(72) Inventors: Fumiyasu Oba, Tokyo (JP); Hideo Hosono, Tokyo (JP); Hidenori Hiramatsu, Tokyo (JP); Hideya Kumomi, Tokyo (JP); Yu Kumagai, Tokyo (JP); Soshi Iimura, Tokyo (JP); Yoshinori Muraba, Tokyo (JP); Lee Alan Burton, Tokyo (JP); Isao Tanaka, Kyoto (JP); Yoyo Hinuma, Chiba (JP)

(73) Assignee: PANASONIC CORPORATION, Osaka (JP)

( * ) Notice: Subject to any disclaimer, the term of this patent is extended or adjusted under 35 U.S.C. 154(b) by 0 days.

(21) Appl. No.: 16/387,155

(22) Filed: Apr. 17, 2019

(65) Prior Publication Data

US 2019/0248670 A1    Aug. 15, 2019

Related U.S. Application Data

(63) Continuation of application No. 15/767,550, filed as application No. PCT/JP2016/080597 on Oct. 14, 2016, now Pat. No. 10,308,521.

(30) Foreign Application Priority Data

Oct. 15, 2015 (JP) ................................. 2015-203891

(51) Int. Cl.
*C01G 9/00* (2006.01)
*C01B 21/06* (2006.01)
(Continued)

(52) U.S. Cl.
CPC .......... *C01G 9/006* (2013.01); *C01B 21/0602* (2013.01); *C01G 9/00* (2013.01);
(Continued)

(58) Field of Classification Search
None
See application file for complete search history.

(56) References Cited

U.S. PATENT DOCUMENTS 7,141,228 B2    11/2006   Lacoste
2005/0217722 A1  10/2005  Komatsu et al.
(Continued)

FOREIGN PATENT DOCUMENTS

JP    2001322814    11/2001
JP    2008084512    4/2008
(Continued)

OTHER PUBLICATIONS

Chern, M. Y. et al., "Synthesis, Structure, and Properties of Ca2ZnN2," Journal of Solid State Chemistry, vol. 88, Issue 2, pp. 528-533, 1990.
(Continued)

*Primary Examiner* — Katie L. Hammer
(74) *Attorney, Agent, or Firm* — Hamre, Schumann, Mueller & Larson, P.C.

(57) ABSTRACT

The present invention provides a zinc nitride compound suitable for electronic devices such as high-speed transistors, high-efficiency visible light-emitting devices, high-efficiency solar cells, and high-sensitivity visible light sensors. The zinc nitride compound is represented, for example, by the chemical formula $CaZn_2N_2$ or the chemical formula $X^1{}_2ZnN_2$ wherein $X^1$ is Be or Mg. The zinc nitride compound is preferably synthesized at a high pressure of 1 GPa or more.

20 Claims, 10 Drawing Sheets

(51) Int. Cl.
*C09K 11/08* (2006.01)
*C09K 11/55* (2006.01)
*C09K 11/54* (2006.01)
*H01L 29/24* (2006.01)
*H01L 31/032* (2006.01)
*H01L 33/26* (2010.01)
*C01G 9/08* (2006.01)
*H01L 31/18* (2006.01)
*H01L 31/0248* (2006.01)
*H01L 31/0256* (2006.01)
*H01L 33/00* (2010.01)

(52) U.S. Cl.
CPC ............ *C01G 9/08* (2013.01); *C09K 11/0883* (2013.01); *C09K 11/54* (2013.01); *C09K 11/55* (2013.01); *H01L 29/24* (2013.01); *H01L 31/0248* (2013.01); *H01L 31/0256* (2013.01); *H01L 31/032* (2013.01); *H01L 31/18* (2013.01); *H01L 33/00* (2013.01); *H01L 33/26* (2013.01); *C01P 2002/72* (2013.01); *C01P 2002/77* (2013.01); *C01P 2006/40* (2013.01); *Y02P 70/521* (2015.11)

(56) References Cited

U.S. PATENT DOCUMENTS

| | | | |
|---|---|---|---|
| 2007/0104865 A1* | 5/2007 | Pickett | .................. C01B 19/002 427/212 |
| 2007/0133358 A1 | 6/2007 | Kubo et al. | |
| 2009/0160325 A1* | 6/2009 | Yatsunami | ............. H05B 33/14 313/504 |
| 2010/0170563 A1 | 7/2010 | Xue | |
| 2011/0006277 A1 | 1/2011 | Kubo et al. | |
| 2012/0025146 A1* | 2/2012 | Taylor | ..................... H01L 33/26 252/501.1 |
| 2012/0128017 A1 | 5/2012 | Felser et al. | |
| 2015/0014587 A1 | 1/2015 | Taylor et al. | |

FOREIGN PATENT DOCUMENTS

| | | |
|---|---|---|
| JP | 2012031057 | 2/2012 |
| JP | 2015078372 | 4/2015 |
| WO | 2009122567 | 10/2009 |

OTHER PUBLICATIONS

International Search Report issued for International Patent Application No. PCT/JP2016/080597, dated Nov. 8, 2016, 5 pages including English translation.

Hinuma et al., "Discovery of earth-abundant nitride semiconductors by computational screening and high-pressure synthesis", Nature Communications 7:11962, published Jun. 21, 2016, pp. 1-10. (Year: 2016).

* cited by examiner

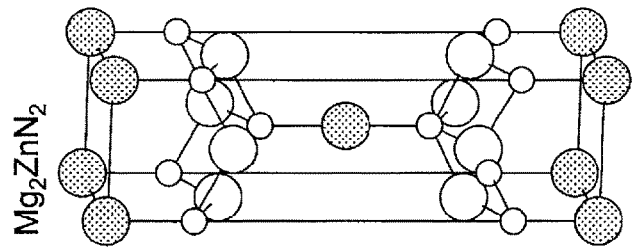
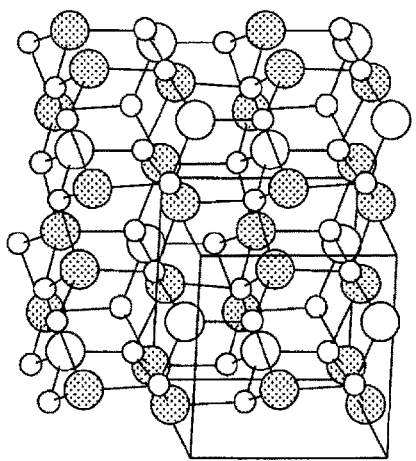
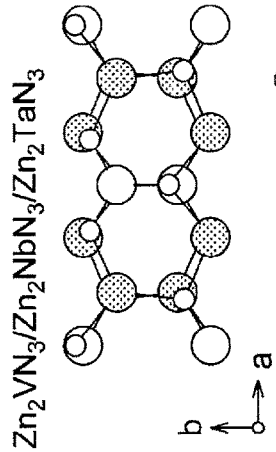
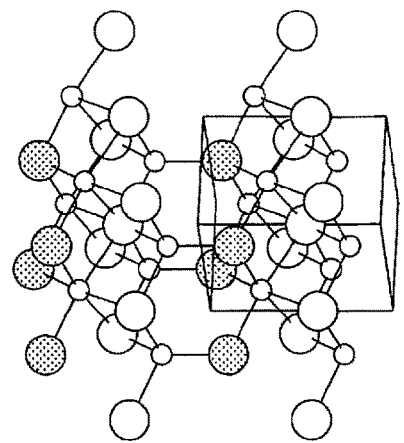
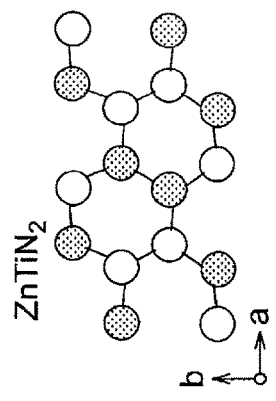
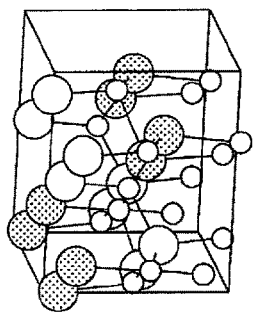
FIG.3A  FIG.3B  FIG.3C  FIG.3D  FIG.3E

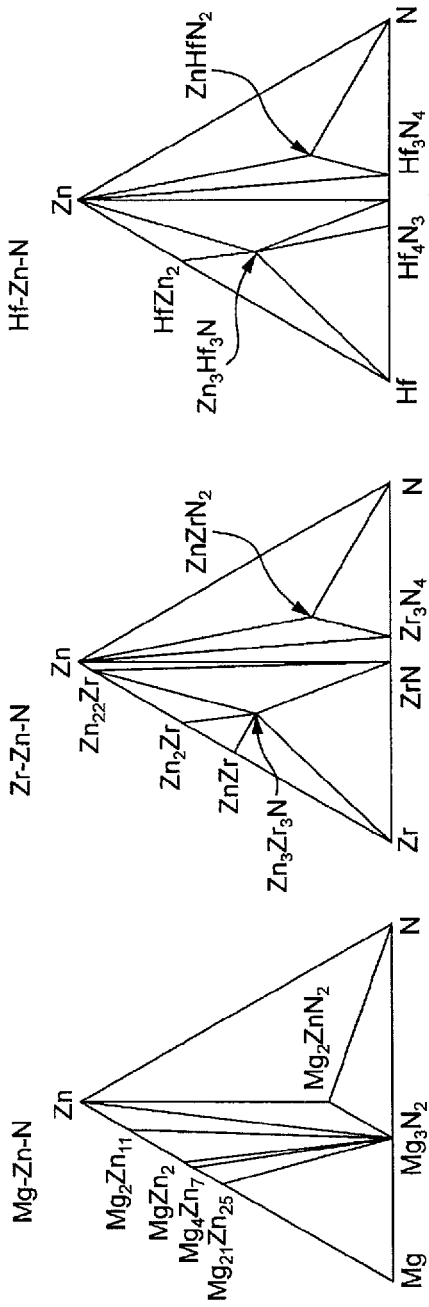
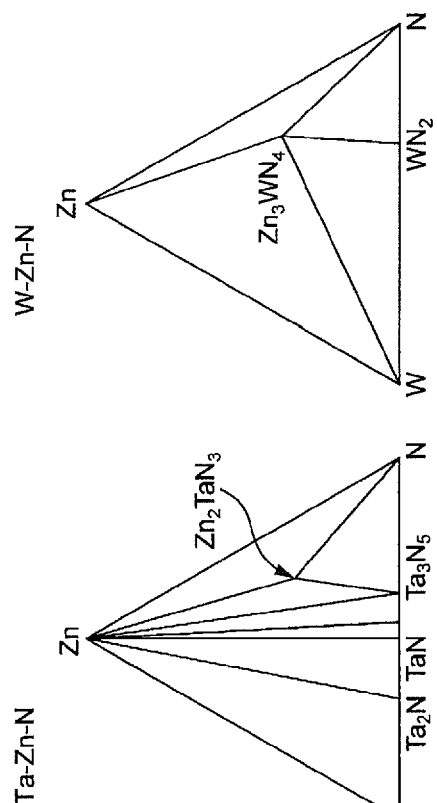
FIG.4A FIG.4B FIG.4C FIG.4D FIG.4E FIG.4F FIG.4G

ZINC NITRIDE COMPOUND AND METHOD FOR PRODUCING SAME

TECHNICAL FIELD

The present invention relates to a zinc nitride compound and a method for producing the same.

BACKGROUND ART

GaN is widely used in LED light sources. However, GaN has a wide band gap and therefore cannot emit light in the visible range by itself. InN has too narrow a band gap, due to which it cannot emit light in the visible range. Ga is a high-cost element, and In is a scarce element. Various zinc nitride compounds have been proposed; however, for example, $ZnSnN_2$ is difficult to produce in the form of a p-type semiconductor, and $Ca_2ZnN_2$ is an indirect band gap semiconductor. The problem with these zinc nitride compounds is that, for example, they are unsuitable for use in light-emitting devices or high-efficiency solar cells (Non Patent Literature 1).

CITATION LIST

Non Patent Literature

Non Patent Literature 1; J. Solid State Chem. 88, 528-533 (1990)

SUMMARY OF INVENTION

Technical Problem

It is an object of the present invention to solve the above problem and provide a zinc nitride compound suitable for electronic devices such as high-speed transistors, high-efficiency visible light-emitting devices, high-efficiency solar cells, and high-sensitivity visible light sensors.

Solution to Problem

The present disclosure provides the following inventions to solve the above problem.

(1) A zinc nitride compound represented by the chemical formula $CaZn_2N_2$.

(2) A zinc nitride compound represented by the chemical formula $X^1{}_2ZnN_2$ wherein $X^1$ is Be or Mg.

(3) A zinc nitride compound represented by the chemical formula $Zn_3LaN_3$.

(4) A zinc nitride compound represented by the chemical formula $ZnTiN_2$.

(5) A zinc nitride compound represented by the chemical formula $ZnX^2N_2$ wherein $X^2$ is Zr or Hf.

(6) A zinc nitride compound represented by the chemical formula $Zn_2X^3N_3$ wherein $X^3$ is V, Nb, or Ta.

(7) A zinc nitride compound represented by the chemical formula $Zn_3WN_4$.

(8) The zinc nitride compound according to any one of (1) to (7), being a compound semiconductor.

(9) The zinc nitride compound according to (1) or (3), being a direct band gap compound semiconductor.

(10) A compound semiconductor represented by the chemical formula $CaM^1{}_{2x}Zn_{2(1-x)}N_2$ wherein $M^1$ is Mg or Cd and $0 \leq x \leq 1$ or $M^2{}_xCa_{1-x}Zn_2N_2$ wherein $M^2$ is Sr or Ba and $0 \leq x \leq 1$, the compound semiconductor having a band gap of 0.4 eV to 3.2 eV.

(11) An electronic device including an active layer including the compound semiconductor according to any one of (8) to (10).

(12) The electronic device according to (11), wherein the electronic device emits light in the visible range under current injection.

(13) The electronic device according to (11), wherein the electronic device generates a photovoltage or a photocurrent by absorbing visible light.

(14) A method for producing the zinc nitride compound according to any one of (1) to (7), including synthesizing the zinc nitride compound at a high pressure of 1 GPa or more.

Advantageous Effects of Invention

The zinc nitride compound of the present invention can be provided as a zinc nitride compound suitable for electronic devices such as high-speed transistors, high-efficiency visible light-emitting devices, high-efficiency solar cells, and high-sensitivity visible light sensors.

BRIEF DESCRIPTION OF DRAWINGS

FIGS. 3A-3E show the crystal structures of typical zinc nitride compounds of the present invention other than the zinc nitride compound A) represented by the chemical formula $CaZn_2N_2$.

FIGS. 4A-4G show the calculated phase diagrams of the systems such as the Mg—Zn—N system for the typical zinc nitride compounds of the present invention other than the zinc nitride compound A) represented by the chemical formula $CaZn_2N_2$.

DESCRIPTION OF EMBODIMENTS

The zinc nitride compound of the present invention can be represented by any one of the following chemical formulae.

A) A zinc nitride compound represented by the chemical formula $CaZn_2N_2$.

B) A zinc nitride compound represented by the chemical formula $X^1_2ZnN_2$ wherein $X^1$ is Be or Mg.

C) A zinc nitride compound represented by the chemical formula $Zn_3LaN_3$.

D) A zinc nitride compound represented by the chemical formula $ZnTiN_2$.

E) A zinc nitride compound represented by the chemical formula $ZnX^2N_2$ wherein $X^2$ is Zr or Hf.

F) A zinc nitride compound represented by the chemical formula $Zn_2X^3N_3$ wherein $X^3$ is V, Nb, or Ta.

G) A zinc nitride compound represented by the chemical formula $Zn_3WN_4$.

Figure 1A:
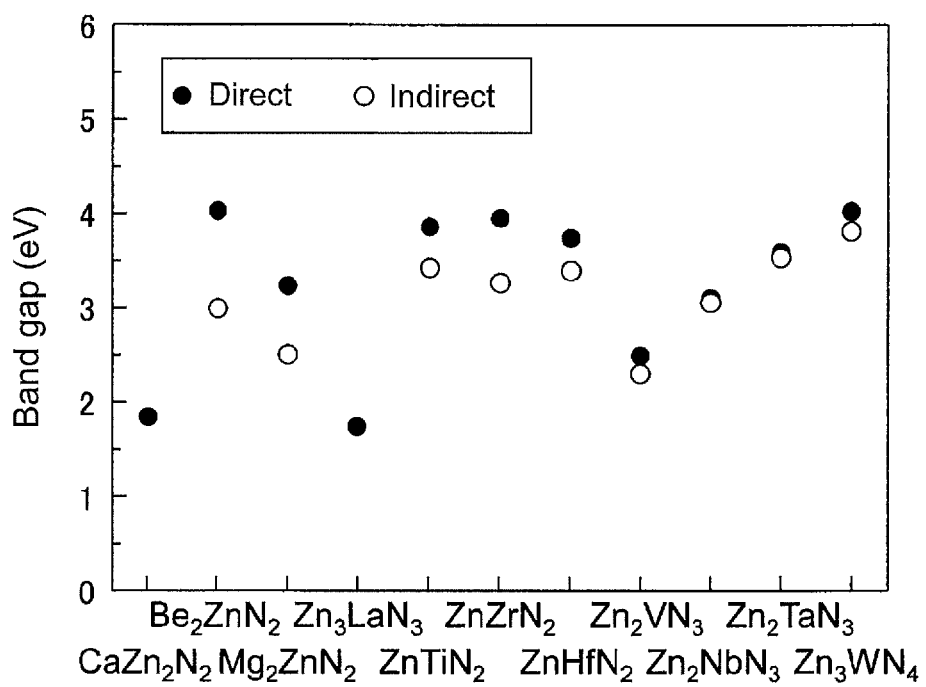
FIG. 1A and FIG. 1B show the basic electronic properties of zinc nitride compounds according to the present invention.
Figure 1B:
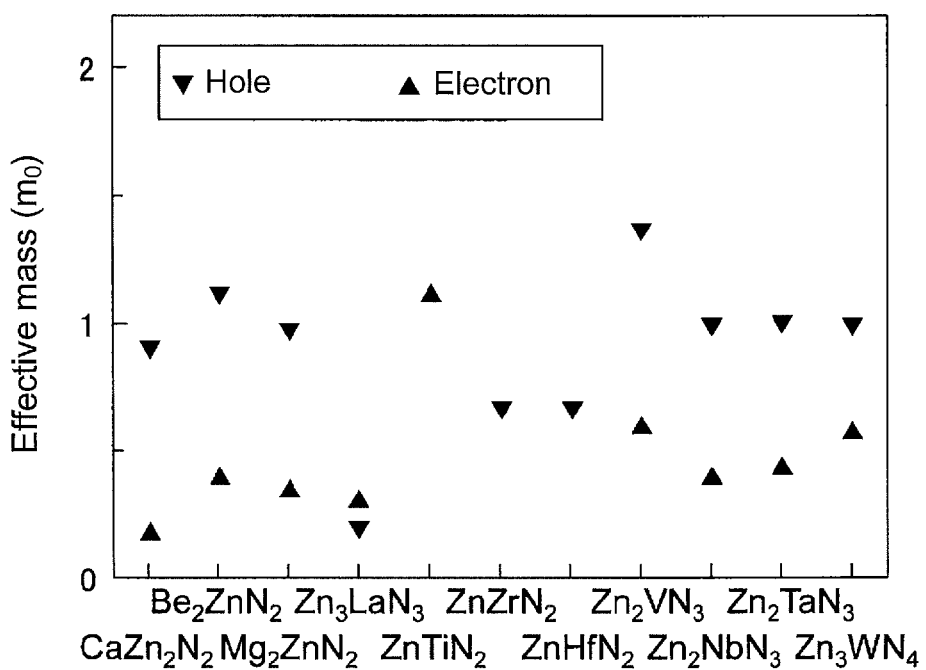

The zinc nitride compounds A) to G) according to the present invention are novel compounds which are not included in Inorganic Crystal Structure Database (ICSD). The basic electronic properties of the zinc nitride compounds A) to G) according to the present invention are shown in FIG. 1A-B. FIG. 1A shows the band gaps (● represents a direct band gap, while ○ represents an indirect band gap), and FIG. 1B shows the effective masses of holes and electrons. The zinc nitride compounds according to the present invention are compound semiconductors. In particular, the zinc nitride compound A) or C) according to the present invention which is represented by the chemical formula $CaZn_2N_2$ or $Zn_3LaN_3$ is a direct band gap compound semiconductor and suitable for use, for example, in light-emitting devices and thin-film solar cells.

The space groups to which the zinc nitride compounds according to the present invention belong are as follows.

The zinc nitride compound A) belongs to the space group P·3m1.

The zinc nitride compound B) belongs to the space group I4/mmm.

The zinc nitride compound C) belongs to the space group $P6_3/m$.

The zinc nitride compound D) belongs to the space group $Pna2_1$.

The zinc nitride compound E) belongs to the space group P3m1.

The zinc nitride compound F) belongs to the space group $Cmc2_1$.

The zinc nitride compound G) belongs to the space group $Pmn2_1$.

Hereinafter, the zinc nitride compound A) represented by the chemical formula $CaZn_2N_2$, which is suitable as a direct band gap compound semiconductor, will be described as a representative of the zinc nitride compounds of the present invention. Understanding of the other zinc nitride compounds denoted by B) to G) can also be gained from the entire contents of the detailed description.

Figure 2A:
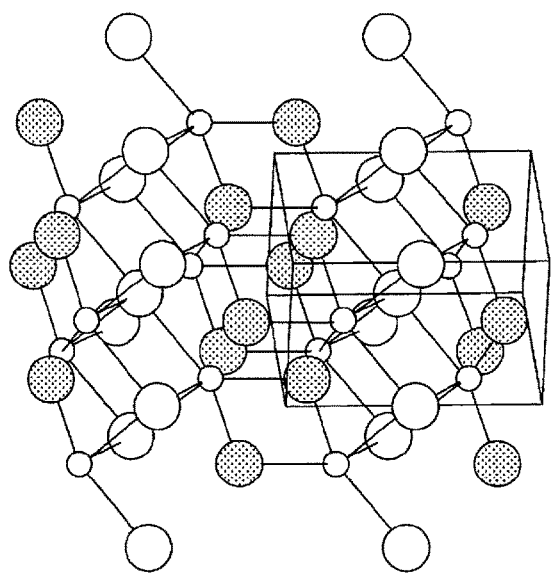
FIG. 2A shows the crystal structure of the zinc nitride compound represented by the chemical formula $CaZn_2N_2$.
Figure 2B:
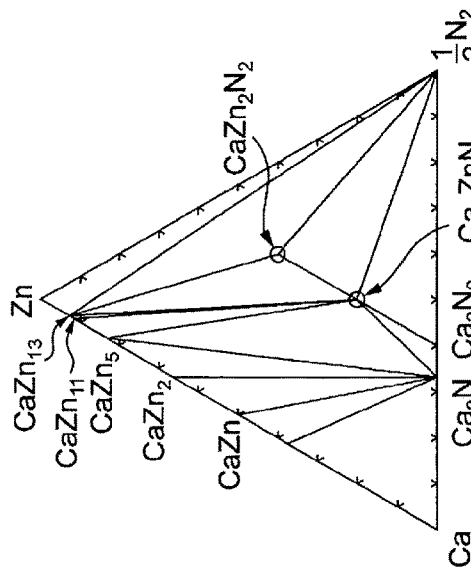
FIG. 2B shows the calculated phase diagram of the Ca—Zn—N system.
Figure 2C:
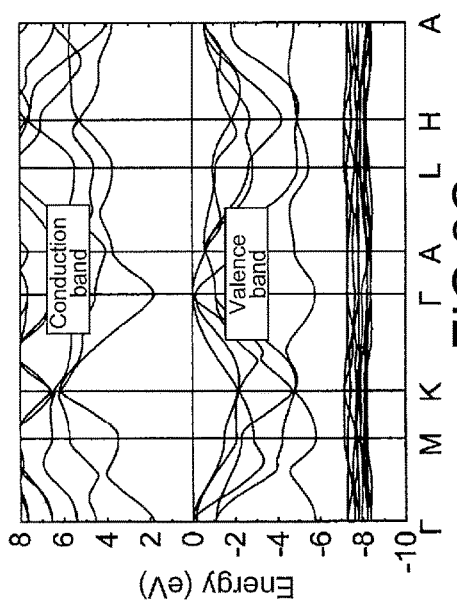
FIG. 2C shows the band structure (conduction band and valence band) of the zinc nitride compound represented by $CaZn_2N_2$.
Figure 2D:
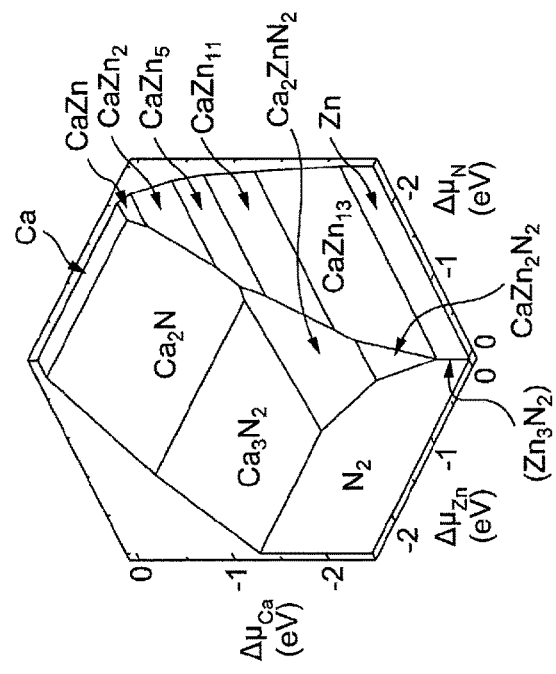
FIG. 2D shows the phase diagram of the Ca—Zn—N system in the chemical potential space.
Figure 5A:
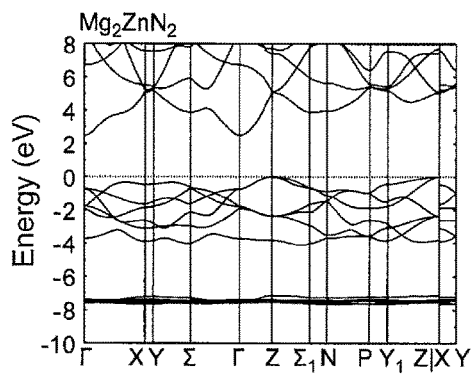
FIGS. 5A-5G show the band structures (conduction bands and valence bands) of the typical zinc nitride compounds of the present invention other than the zinc nitride compound A) represented by the chemical formula $CaZn_2N_2$.
Figure 5B:
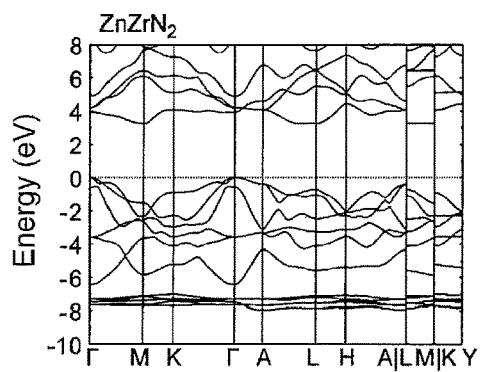
Figure 5C:
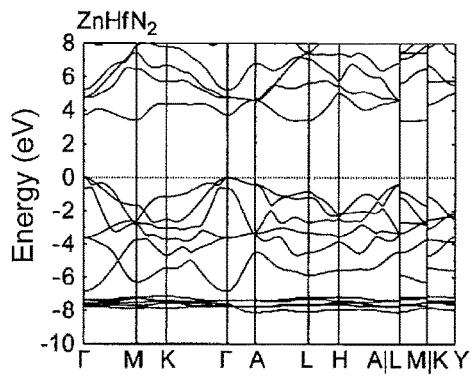
Figure 5D:
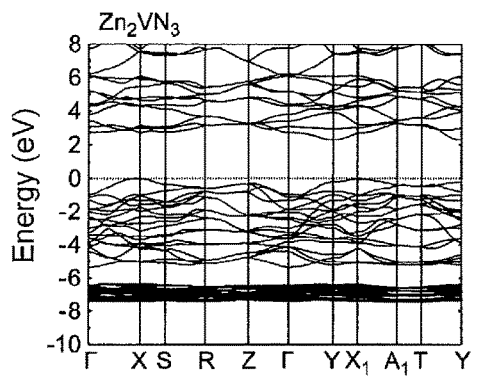
Figure 5E:
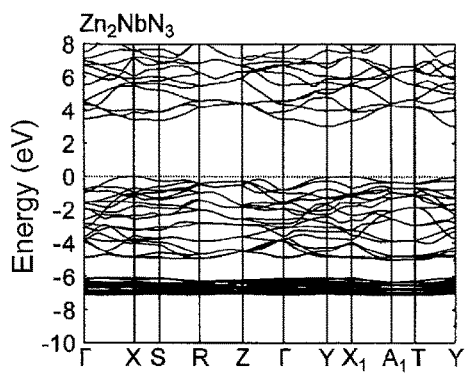
Figure 5F:
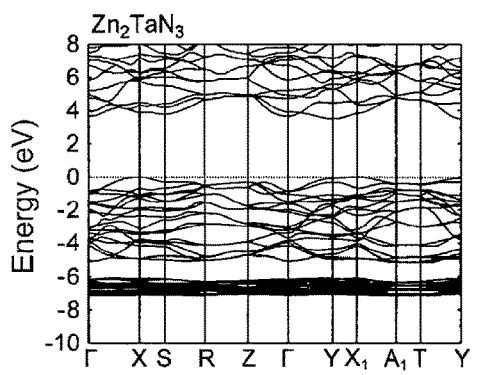
Figure 5G:
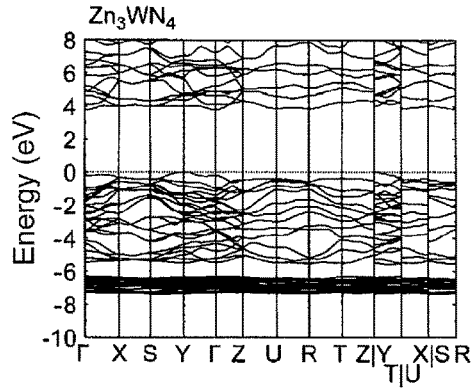

In FIG. 2A-D, FIG. 2A shows the crystal structure of the zinc nitride compound A) represented by the chemical formula $CaZn_2N_2$, FIG. 2B shows the calculated phase diagram of the Ca—Zn—N system, FIG. 2C shows the band structure (conduction band and valence band) of the zinc nitride compound represented by $CaZn_2N_2$, and FIG. 2D shows the phase diagram of the Ca—Zn—N system in the chemical potential space. As seen from FIG. 2D, $CaZn_2N_2$ is stable at a high nitrogen chemical potential, namely at a high nitrogen partial pressure.

The zinc nitride compound A) represented by the chemical formula $CaZn_2N_2$ has a band gap of 1.9 eV. The band gap can be controlled by incorporation of Mg, Sr, Ba, or Cd, which results in a compound semiconductor represented by the chemical formula $CaM^1_{2x}Zn_{2(1-x)}N_2$ wherein $M^1$ is Mg or Cd and $0 \le x \le 1$ or $M^2_xCa_{1-x}Zn_2N_2$ wherein $M^2$ is Sr or Ba and $0 \le x \le 1$ and having a band gap of 0.4 eV to 3.2 eV.

$CaZn_2N_2$ can be an n-type semiconductor even when undoped, since nitrogen holes serving as shallow donors are likely to be generated in $CaZn_2N_2$. However, it is preferable to form an n-type semiconductor by doping into $CaZn_2N_2$. Furthermore, for example, a higher nitrogen partial pressure reduces carrier compensation by nitrogen holes, thus allowing the formation of a p-type semiconductor by doping into $CaZn_2N_2$.

The zinc nitride compound A) represented by the chemical formula $CaZn_2N_2$ is preferably synthesized at a high pressure of 1 GPa or more. In this case, the starting compounds, preferably $Ca_3N_2$ and $2Zn_3N_2$, are introduced into a high-pressure synthesis apparatus and reacted typically at 800 to 1500° C. and 1 to 10 GPa for about 30 minutes to 5 hours.

The resulting high-pressure synthesis product can be purified by removing zinc from the product. It is preferable to put a powder of the resulting high-pressure synthesis product and $I_2$, for example, into a glass vessel and place the glass vessel in an atmosphere of an inert gas such as argon or nitrogen at about 15 to 30° C., preferably at room temperature, for about 5 to 10 minutes, thereby converting zinc to zinc iodide ($ZnI_2$). The zinc iodide produced is then dissolved in a solvent such as dimethyl ether, and the solution is removed. The purpose of using an inert atmosphere is to inhibit oxidation of $Zn^{2+}$ and $I^-$.

The zinc nitride compound of the present invention can be obtained not only by the above high-pressure synthesis but also by depositing the compound as a thin film on a substrate using a physical vapor deposition process such as sputtering, pulsed laser deposition, or vacuum deposition or a chemical vapor deposition process such as organometallic chemical vapor deposition. The substrate can be selected as appropriate depending on the intended purpose and, for example, an oxide substrate may be used.

$CaZn_2N_2$ is particularly useful in that it is composed of elements abundant on the earth, it has a direct band gap, and its charge carriers have a small effective mass (the effective mass of electrons is 0.17 $m_0$, and the effective mass of holes is 0.91 $m_0$). The direct band gap of 1.9 eV of $CaZn_2N_2$ corresponds to the red region of visible light, and thus $CaZn_2N_2$ can be expected to show a high theoretical conversion efficiency when used as a light absorbing layer of a solar cell. An electronic device having an active layer made of $CaZn_2N_2$ is useful as an electronic device (light-emitting device) that emits light in the visible range under current injection or as an electronic device (solar cell or light sensor) that generates a photovoltage or a photocurrent by absorbing visible light.

FIGS. 3A to 3E show the crystal structures of the typical zinc nitride compounds of the present invention other than the zinc nitride compound A) represented by the chemical formula $CaZn_2N_2$ just as FIG. 2A shows the crystal structure of the zinc nitride compound A).

FIGS. 4A to 4G show the calculated phase diagrams of the systems such as the Mg—Zn—N system for the typical zinc nitride compounds of the present invention other than the zinc nitride compound A) represented by the chemical formula $CaZn_2N_2$ just as FIG. 2B shows the calculated phase diagram for the zinc nitride compound A).

FIGS. 5A to 5G show the band structures (conduction bands and valence bands) of the typical zinc nitride compounds of the present invention other than the zinc nitride compound A) represented by the chemical formula $CaZn_2N_2$ just as FIG. 2C shows the band structure of the zinc nitride compound A).

INDUSTRIAL APPLICABILITY

The present invention can provide a zinc nitride compound suitable for electronic devices such as high-speed transistors, high-efficiency visible light-emitting devices, high-efficiency solar cells, and high-sensitivity visible light sensors.

EXAMPLES

Hereinafter, the present invention will be described in more detail with Examples.

Example 1

Synthesis of Zinc Nitride Compound Represented by $CaZn_2N_2$

Starting compounds, $Ca_3N_2$ and $Zn_3N_2$ mixed in a molar ratio $Ca_3N_2:Zn_3N_2$ of 1:2, were introduced into a high-pressure synthesis apparatus, which was maintained at 2.5 GPa and 1100° C. for 1 hour. The high-pressure synthesis apparatus used is a belt-type high-pressure synthesis apparatus which has a high-pressure cell as a sample holder, whose pressure control range is from 2 to 5.5 GPa, and whose temperature control range is from room temperature to 1600° C.

Figure 6A:
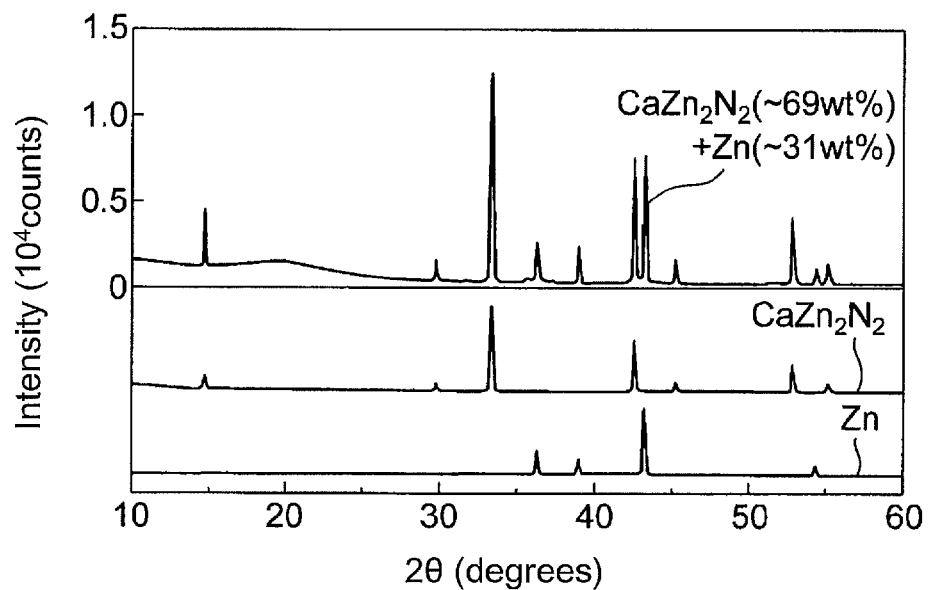
FIG. 6A and FIG. 6B show X-ray diffraction patterns of synthesis products obtained in Example 1 and Comparative Example 1.

X-ray diffraction patterns of the resulting high-pressure synthesis product are shown in FIG. 6A. About 69 wt % of the product consisted of $CaZn_2N_2$, and the rest consisted of Zn. As for the lattice parameters of $CaZn_2N_2$, the lattice parameters a and c were respectively 3.463150(44) Å and 6.01055(11) Å which differ by 0.3% from the theoretical lattice parameters a and c of 3.454 Å and 5.990 Å.

Figure 7A:
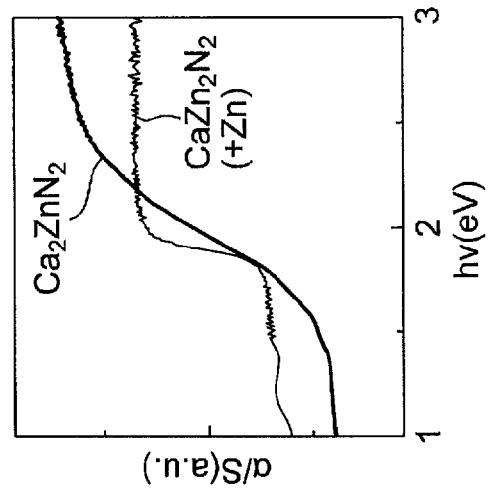
FIGS. 7A-7C show absorption spectra of the synthesis products obtained in Example 1 and Comparative Example 1.
Figure 7B:
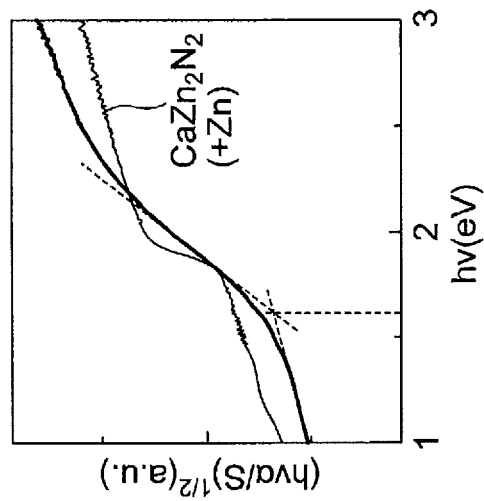
Figure 7C:
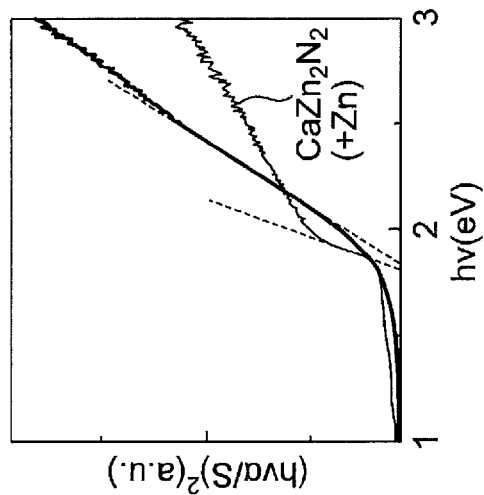

Absorption spectra of $CaZn_2N_2$ as obtained through diffuse reflectance spectroscopy and calculation using the Kubelka-Munk equation are shown in FIGS. 7A to 7C, together with absorption spectra of $Ca_2ZnN_2$ of Comparative Example 1. It is seen that the absorption of $CaZn_2N_2$ sharply rises. $CaZn_2N_2$ had a direct band gap of 1.9 eV (calculated value=1.83 eV).

Figure 6B:
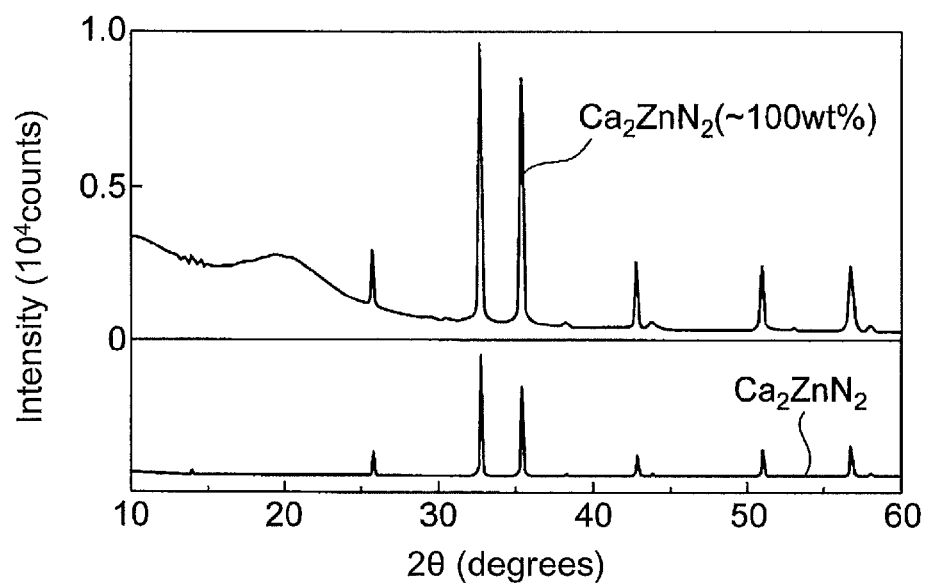

X-ray diffraction patterns of the resulting reaction product are shown in FIG. 6B. The resulting product was $Ca_2ZnN_2$. As for the lattice parameters of $Ca_2ZnN_2$, the lattice parameter a was 3.583646(65) Å which differs by 0.2% from the theoretical lattice parameter a of 3.575 Å, and the lattice parameter c was 12.663346(26) Å which differs by 0.4% from the theoretical lattice parameter c of 12.607 Å.

Absorption spectra of $Ca_2ZnN_2$ as obtained through diffuse reflectance spectroscopy and calculation using the Kubelka-Munk equation are shown in FIGS. 7A to 7C. $Ca_2ZnN_2$ had an indirect band gap of 1.6 eV (calculated value=1.65 eV) and a direct band gap of 1.9 eV (calculated value=1.92 eV).

When synthesis was attempted in the same manner as in Comparative Example 1 except for mixing the starting materials in the ratio used in Example 1, $CaZn_2N_2$ of the present invention was not obtained.

Example 2

Synthesis of Zinc Nitride Compound Represented by $CaZn_2N_2$

Starting compounds, $Ca_3N_2$ and $Zn_3N_2$ mixed in a molar ratio $Ca_3N_2:Zn_3N_2$ of 1:2, were introduced into a high-pressure cell and subjected to high-pressure synthesis in which a pressure of 5.0 GPa was applied at 1200° C. for 1 hour. The high-pressure synthesis apparatus used is a belt-type high-pressure synthesis apparatus which has a high-pressure cell as a sample holder, whose pressure control range is from 2 to 5.5 GPa, and whose temperature control range is from room temperature to 1600° C.

Figure 8:
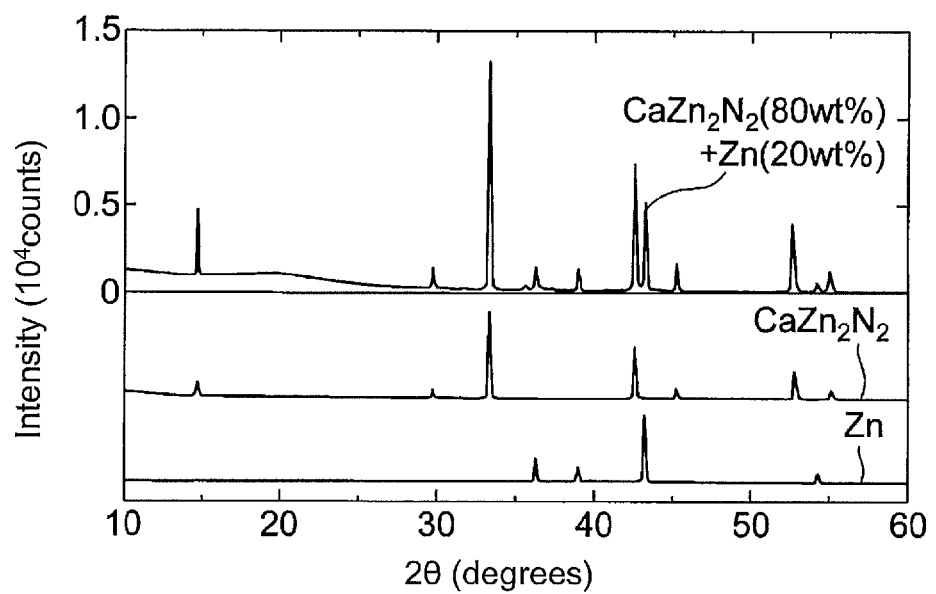
FIG. 8 shows X-ray diffraction patterns of a synthesis product obtained in Example 2.

X-ray diffraction patterns of the resulting high-pressure synthesis product are shown in FIG. 8. About 80 wt % of the product consisted of $CaZn_2N_2$, and the rest consisted of Zn etc. As for the lattice parameters of $CaZn_2N_2$, the lattice parameters a and c were respectively 3.46380(11) Å and 6.00969(30) Å which differ by 0.3% from the theoretical lattice parameters a and c of 3.454 Å and 5.990 Å.

Figure 9A:
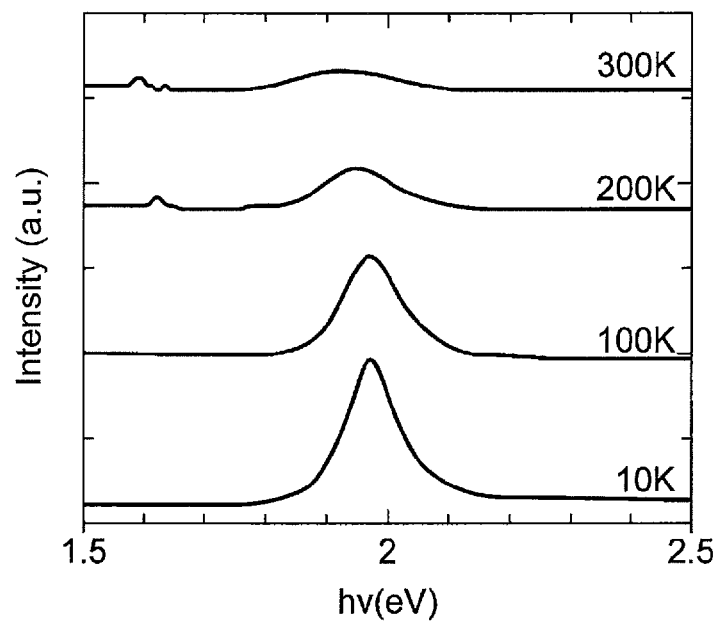
FIG. 9A and FIG. 9B show photoluminescence spectra of the synthesis product obtained in Example 2.
Figure 9B:
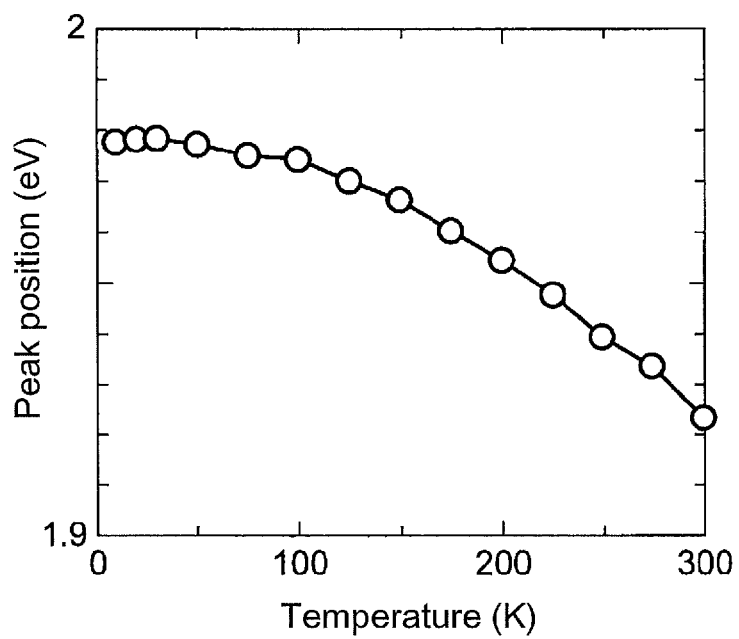

Light emission, in particular photoluminescence, from $CaZn_2N_2$ obtained as the high-pressure synthesis product was examined through photon excitation induced using a third-harmonic Nd:YAG pulsed laser (wavelength: 355 nm, energy density: up to 7 mJ/cm$^2$). Red photoluminescence was clearly observed by visual inspection at 10 K. The results are shown in FIG. 9A-B. FIG. 9A shows photoluminescence spectra obtained at 10 K, 100 K, 200 K, and 300 K, and FIG. 9B shows the temperature dependence of the spectral peak position.

(Purification of $CaZn_2N_2$)

Figure 10:
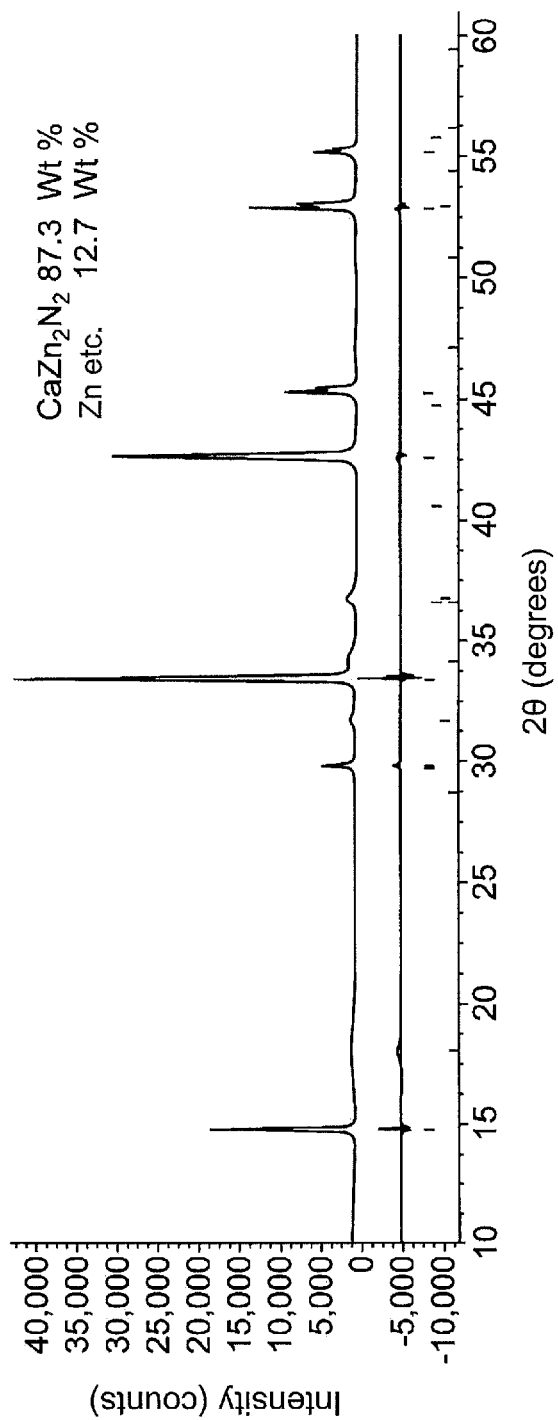
FIG. 10 shows X-ray diffraction patterns of a purified powder product obtained in Example 2.

A powder of the obtained high-pressure synthesis product (including $CaZn_2N_2$ and Zn etc.) and $I_2$ were put into a glass vessel, which was placed in an argon atmosphere at room temperature for about 5 minutes to convert zinc into zinc iodide. The zinc iodide produced was then dissolved in dimethyl ether, and the solution was removed. $CaZn_2N_2$ accounted for about 87.3 wt % of the resulting powder, and zinc etc. accounted for about 12.7 wt % of the powder. X-ray diffraction patterns of the purified powder product are shown in FIG. 10. A pellet for use as a pulsed laser deposition target was able to be formed from about 1 g of the purified powder product using a cold isotropic press (CIP) machine.

The invention claimed is:

1. A zinc nitride compound represented by the chemical formula $X^1_2ZnN_2$ wherein $X^1$ is Be or Mg.

2. A zinc nitride compound represented by the chemical formula $ZnTiN_2$.

3. A zinc nitride compound represented by the chemical formula $Zn_2X^3N_3$ wherein $X^3$ is V, Nb, or Ta.

4. A zinc nitride compound represented by the chemical formula $Zn_3WN_4$.

5. The zinc nitride compound according to claim 1, being a compound semiconductor.

6. The zinc nitride compound according to claim 2, being a compound semiconductor.

7. The zinc nitride compound according to claim 3, being a compound semiconductor.

8. The zinc nitride compound according to claim 4, being a compound semiconductor.

9. An electronic device comprising an active layer comprising the compound semiconductor according to claim 5.

10. An electronic device comprising an active layer comprising the compound semiconductor according to claim 6.

11. An electronic device comprising an active layer comprising the compound semiconductor according to claim 7.

12. An electronic device comprising an active layer comprising the compound semiconductor according to claim 8.

13. The electronic device according to claim 9, wherein the electronic device emits light in the visible range under current injection.

14. The electronic device according to claim 10, wherein the electronic device emits light in the visible range under current injection.

15. The electronic device according to claim 11, wherein the electronic device emits light in the visible range under current injection.

16. The electronic device according to claim 12, wherein the electronic device emits light in the visible range under current injection.

17. The electronic device according to claim 9, wherein the electronic device generates a photovoltage or a photocurrent by absorbing visible light.

18. The electronic device according to claim 10, wherein the electronic device generates a photovoltage or a photocurrent by absorbing visible light.

19. The electronic device according to claim 11, wherein the electronic device generates a photovoltage or a photocurrent by absorbing visible light.

20. The electronic device according to claim 12 wherein the electronic device generates a photovoltage or a photocurrent by absorbing visible light.

\* \* \* \* \*